United States Patent
Lyons et al.

(10) Patent No.: US 6,869,734 B1
(45) Date of Patent: Mar. 22, 2005

(54) EUV REFLECTIVE MASK HAVING A CARBON FILM AND A METHOD OF MAKING SUCH A MASK

(75) Inventors: Christopher F. Lyons, Fremont, CA (US); Cyrus E. Tabery, Sunnyvale, CA (US); Richard J. Huang, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 123 days.

(21) Appl. No.: 10/331,681

(22) Filed: Dec. 30, 2002

Related U.S. Application Data

(60) Provisional application No. 60/399,816, filed on Jul. 31, 2002.

(51) Int. Cl.$^7$ .................................................. G03F 9/00
(52) U.S. Cl. .......................................................... 430/5
(58) Field of Search ............................ 430/5, 322, 323; 378/35

(56) References Cited

U.S. PATENT DOCUMENTS 6,573,030 B1 * 6/2003 Fairbairn et al. ............ 430/323
6,653,735 B1 * 11/2003 Yang et al. .................. 257/758

* cited by examiner

*Primary Examiner*—S. Rosasco
(74) *Attorney, Agent, or Firm*—Foley & Lardner LLP

(57) ABSTRACT

An exemplary embodiment relates to a mask for integrated circuit fabrication equipment. The mask includes a multi-layer film and an amorphous carbon layer above the multi-layer film. The multilayer film is at least partially relatively reflective to radiation having a wavelength of less than 70 nanometers.

20 Claims, 3 Drawing Sheets

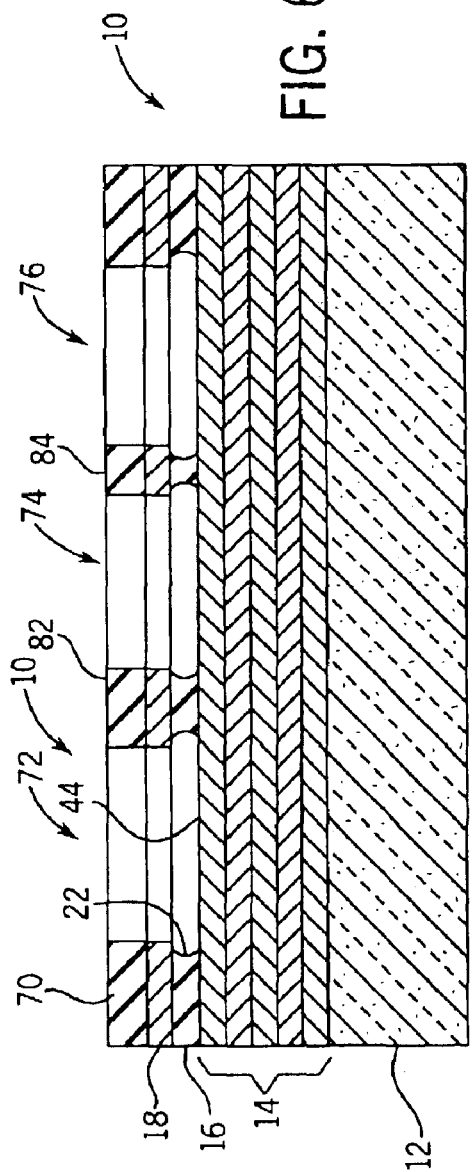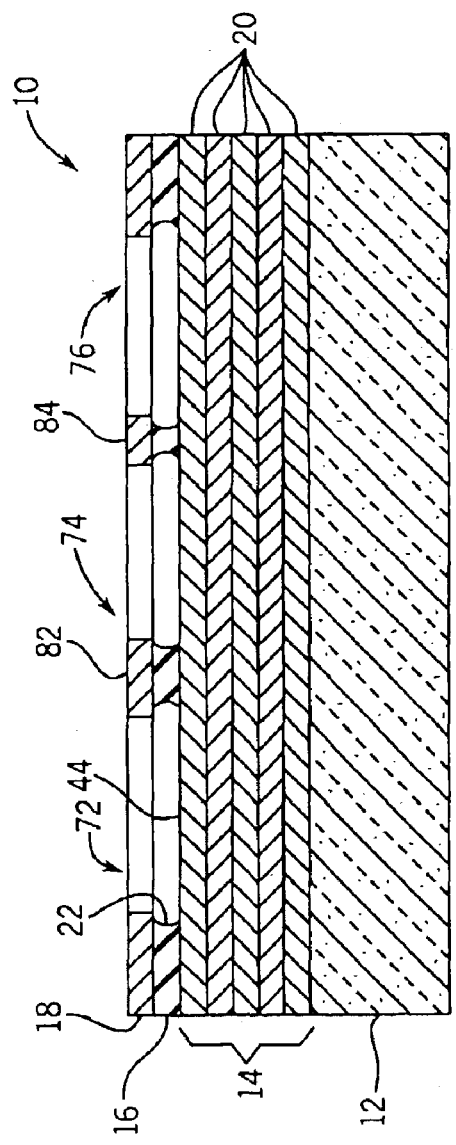

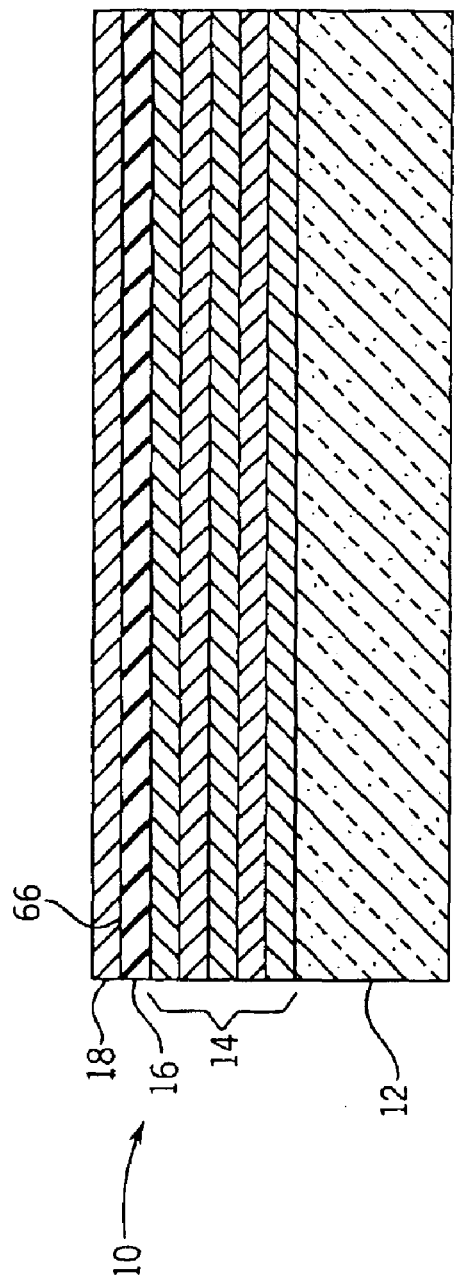
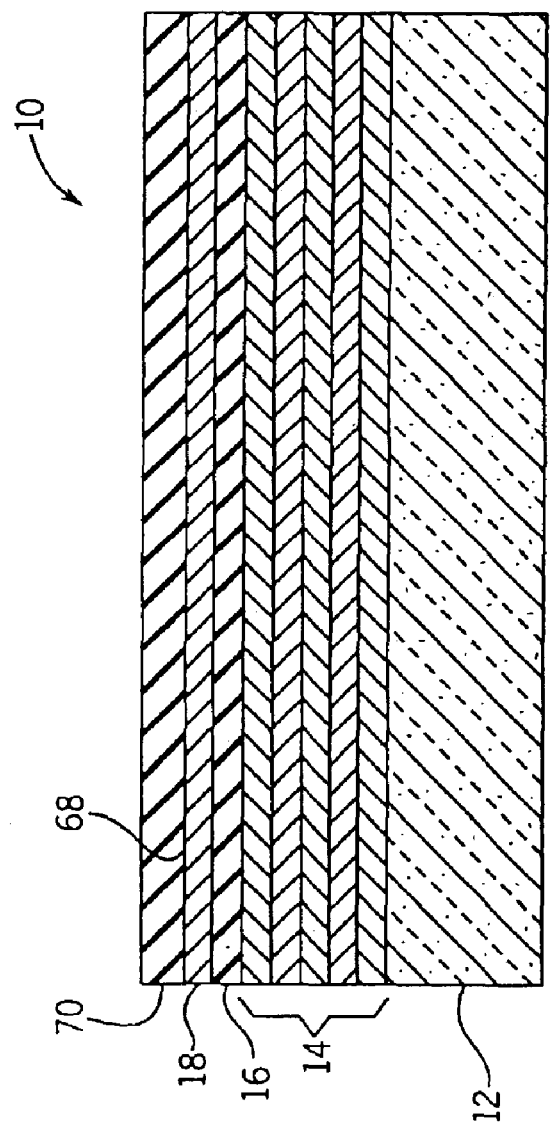

EUV REFLECTIVE MASK HAVING A CARBON FILM AND A METHOD OF MAKING SUCH A MASK

This application claims priority to provisional application 60/399,816, filed Jul. 31, 2002, which is incorporated herein by reference in its entirety.

FIELD OF THE INVENTION

The present invention relates generally to integrated circuit (IC) fabrication equipment. More particularly, the present invention relates to an EUV reflective mask-having a low temperature buffer and absorber film and a method of making such a mask.

BACKGROUND OF THE INVENTION

Semiconductor fabrication techniques often utilize a mask or reticle. Radiation is provided through or reflected off the mask or reticle to form an image on a semiconductor wafer. The wafer is positioned to receive the radiation transmitted through or reflected off the mask or reticle. The image on the wafer corresponds to the pattern on the mask or reticle. The radiation can be light, such as ultraviolet light, vacuum ultraviolet (VUV) light, extreme ultraviolet light (EUV) and deep ultraviolet light. The radiation can also be x-ray radiation, e-beam radiation, etc.

One advanced form of lithography is extreme ultraviolet (EUV) light lithography. A conventional EUV system (e.g., an optical reduction camera or stepper) utilizes an EUV radiation source, an EUV lens assembly (e.g., a condenser lens), an EUV reticle, and another EUV lens assembly (e.g., an objective lens). EUV radiation can be created at the radiation source and projected onto the reticle. The EUV reticle is typically a resonant-reflective medium including an IC pattern of absorbing material. The resonant reflective medium reflects a substantial portion of the EUV radiation in accordance with the IC pattern to the second EUV lens assembly. The lens assemblies can be an all resonant-reflective imaging system including aspheric optics at 4:1 magnification factor (e.g., a series of high precision mirrors). EUV radiation reflected off the EUV reticle is provided from the second EUV lens assembly to a photoresist coated wafer.

EUV lithography utilizes radiation in a wavelength of 5 to 70 nanometers (e.g., 11–14 nanometers). A conventional EUV lithographic system or EUV stepper provides the EUV reticle as a multilayer coated reflective mask or reticle which has an absorber pattern across its surface. The multilayer coated reflective reticle (i.e., the resonant reflective medium) can utilize molybdenum/silicon (Mo—Si) layers or molybdenum/beryllium layers (Mo—Be).

EUV lithography can employ a reflective mask consisting of a patterned absorber on a multilayer coated substrate (mask blank) that reflects a narrow band of EUV wavelengths near 13.4 nm. Such masks have the advantage of being thick and dimensionally stable; however, the use of such masks presents some challenges.

Current EUV reflective masks use silicon oxide ($SiO_2$) as buffer layers to protect delicate multilayer reflectors. Metal layers are used as absorbers. While the silicon oxide buffer layers and metal layer absorbers are effective, the high temperature processing required by these layers can degrade the reflector (e.g., the Mo—Si or Mo—Be layers).

Conventional EUV multilayer reflectors can also be very delicate due to the need for precise interface properties to achieve high reflectance. Depositing metal absorbers and glass ($SiO_2$) buffers add unwanted thermal cycles that can blur the interfaces and reduce reflectance.

Thus, there is a need for a low temperature layer in an EUV reflective mask. Further, there is a need to use amorphous carbon layers as absorbers or buffers or both. Even further, there is a need to make an EUV mask with high reflectance.

SUMMARY OF THE INVENTION

An exemplary embodiment relates to a mask for integrated circuit fabrication equipment. The mask includes a multilayer film and an amorphous carbon layer above the multilayer film. The multilayer film is at least partially relatively reflective to radiation having a wavelength of less than 70 nanometers.

Another exemplary embodiment relates to an lithographic mask for fabrication equipment. The mask can include means for reflecting radiation and means for absorbing the radiation. The means for absorbing the radiation includes an amorphous carbon layer located above the means for reflecting radiation.

Another exemplary embodiment relates to a method of manufacturing a mask. The method includes providing a multilayer film on a substrate, providing an amorphous carbon mask over the multilayer film, and etching the amorphous carbon mask selectively to form a pattern.

Other principle features and advantages of the invention will become apparent to those skilled in the art upon review of the following drawings, the detailed description, and the appended claims.

BRIEF DESCRIPTION OF THE DRAWINGS

Exemplary embodiments will hereafter be described with reference to the accompanying drawings, wherein like numerals denote like elements, and:

FIG. 1 is a schematic cross-sectional view of an lithographic mask in accordance with an exemplary embodiment;

FIG. 4 is a schematic cross-sectional view of the lithographic mask illustrated in FIG. 3, showing a reflective layer deposition step;

FIG. 5 is a schematic cross-sectional view of the lithographic mask illustrated in FIG. 4, showing a photoresist deposition step; and FIG. 6 is a schematic cross-sectional view of the lithographic mask illustrated in FIG. 5, showing a selective etching step.

DETAILED DESCRIPTION OF EXEMPLARY EMBODIMENTS

Figure 2:
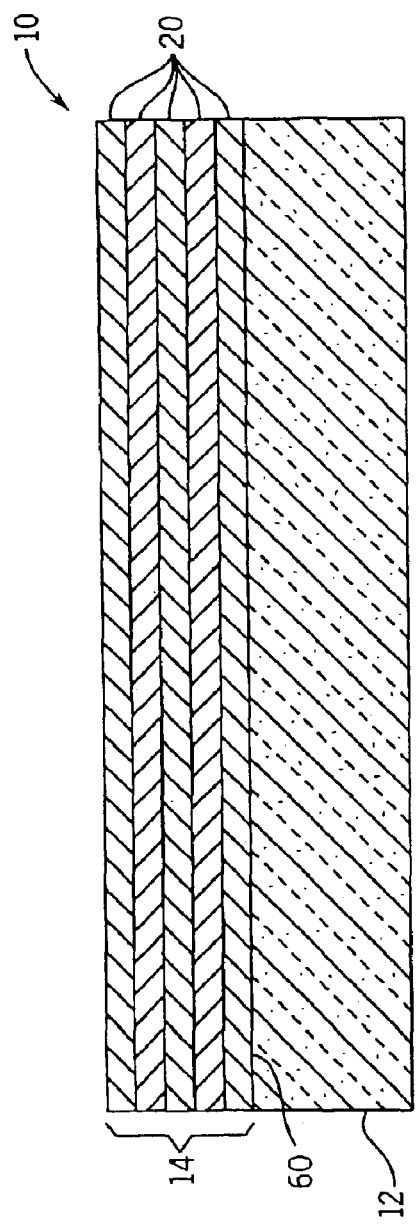
FIG. 2 is a schematic cross-sectional view of the lithographic mask illustrated in FIG. 1, showing a multilayer film formation step.

With reference to FIG. 1, a binary mask 10 is provided for use with semiconductor fabrication equipment. Mask 10 can be utilized in extreme ultraviolet (EUV) lithography in which radiation has a wavelength of less than 70 nm is utilized (preferably between 5 and 14 nm). For example, radiation or ultraviolet light at a wavelength of 13.5 nm can be reflected off mask 10 to a semiconductor wafer coated with a photoresist. Alternatively, mask 10 can be employed at other locations with respect to the EUV or advanced lithographic system.

Binary mask 10 includes a substrate 12, a multilayer 14, a buffer or barrier layer 16, and an absorbing layer 18. Substrate 12 can be a low thermal expansion material (LTEM), such as, ultra low expansion (ULE) glass manufactured by Corning. Alternatively, substrate 12 can be a silicon oxynitride (SiON) material. Layer 14 includes individual films or thin layers 20 of various materials.

Multilayer 14 is provided above substrate 12. Layers 20 of multilayer 14 can be molybdenum/beryllium (Mo—Be) film pairs (i.e., a layer of molybdenum above or below a layer of beryllium in each film pair). Each film pair is configured for maximum reflectance in the EUV band. Alternatively, layers 20 can be molybdenum/silicon (Mo—Si) film pairs configured for maximum reflectance in the EUV band. Each Mo—Si or Mo—Be film pair can be 5–7 nm thick. Multilayer 14 can include as many as forty pairs or more of layers 20 and have a total thickness of 300 nm.

Multilayer 14 is configured for reflectance at the actinic wavelength associated with the advanced lithographic or EUV lithographic system. The actinic wavelength is the wavelength which causes photochemical reactions to take place in the photoresist material on the wafer. Multilayer 14 can be manufactured by Osmic.

Alternative materials for multilayer 14 can also be used depending upon design parameters and system requirements. Any material highly reflective at EUV wavelengths (i.e., an EUV mirror) can be utilized for multilayer 14.

Barrier layer 16 is disposed above multilayer 14. Barrier layer 16 preferably has different etch characteristics than multilayer 14 (more particularly, different etch characteristics than the closest of layers 20 to layer 16). In an exemplary embodiment, barrier layer 16 includes amorphous carbon material. Contrary to conventional masks which utilize silicon dioxide as a barrier material, mask 10 preferably utilizes amorphous carbon. The amorphous carbon may contain other variations in its crystallographic structure.

Amorphous carbon can be deposited at a lower temperature than $SiO_2$. For example, amorphous carbon can be deposited at a temperature of 100° C. Layer 16 includes an undercut 22 associated with an etching of aperture 26 discussed below with reference to FIG. 6.

An absorptive layer 18 is disposed above layer 16 and preferably has different etch characteristics than layer 16. Layer 18 can have similar etch characteristics to those of multilayer 14 (e.g., those of the closest of layers 20 to layer 16). Alternatively, layer 18 can have different etch characteristics than those of the closest of layers 20 to layer 16. Layers 16 and 18 are preferably materials which can be easily deposited and etched in accordance with conventional fabrication techniques.

Layer 16 can be a 10–200 nm thick film or layer of amorphous carbon. Layer 18 is preferably an absorptive metal layer at the actinic wavelength. Layer 18 can be a 30 nm–100 nm thick layer or film of chromium, chromium oxide, titanium nitride or tantalum nitride. Alternatively, layer 18 is an amorphous carbon layer or layer 18 and layer 16 are replaced by layer 16 including amorphous carbon. Advantageously, amorphous carbon protects multilayer 14 and absorbs EUV radiation.

With reference to FIGS. 1–6, an exemplary method for fabricating binary mask 10 is described below as follows. As discussed above, mask 10 is manufactured without relying upon conventional phase shifting layers.

In FIG. 2, mask 10 is provided as a mask blank and includes substrate 12 and multilayer 14. Substrate 12 can be an industry standard thickness. Substrate 12 and multilayer 14 can be a variety of shapes including squares, circles, ovals, rectangles, etc.

Layers 20 of multilayer 14 are preferably alternating layers of molybdenum and silicon, each 2–7 nm thick. Multilayer 14 is preferably formed on a top surface 60 of substrate 12. Multilayer 14 can include any number of layers 20 of various sizes depending upon the desired reflective properties for mask 10. As shown in FIG. 2, mask 10 does not yet include a pattern for reflecting an image to photoresist material on a semiconductor wafer.

Figure 3:
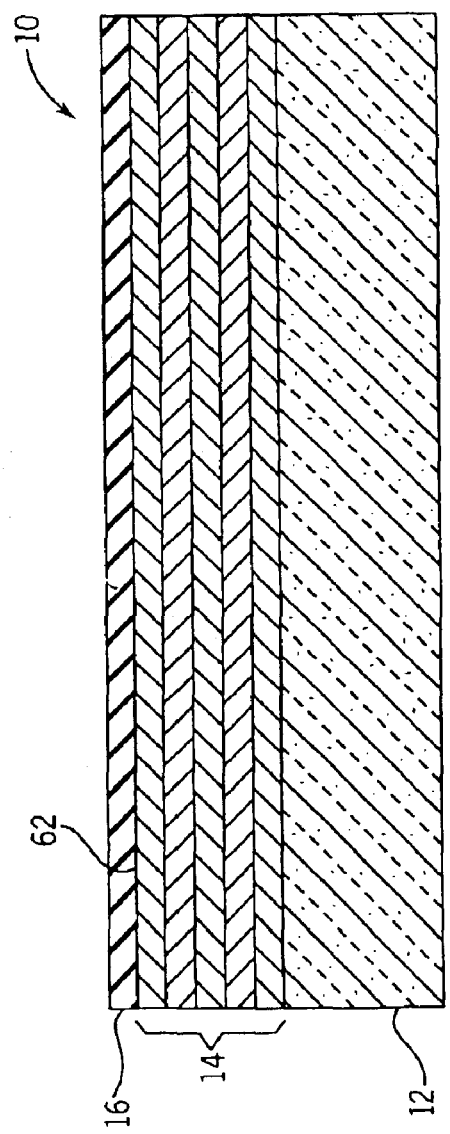
FIG. 3 is a schematic cross-sectional view of the lithographic mask illustrated in FIG. 2, showing a barrier layer deposition step.

In FIG. 3, film or repair buffer layer 16 is provided above a top surface 62 of multilayer 14. Layer 16 can be a 10–200 nm thick amorphous carbon layer. Layer 16 can be deposited by a variety of processes including sputter deposition or chemical vapor deposition.

In FIG. 4, a film or reflective layer 18 is provided above a top surface 66 of layer 16. Layer 18 is preferably an absorbing layer with respect to the radiation provided in the lithographic system and a reflective or blocking layer with respect to the radiation used in the heat treatment step described below with reference to FIG. 7. Layer 18 can be a 30–300 nm thick layer of metal, such as, chromium. Layers 16 and 18 preferably have different etch characteristics. Alternatively, layer 18 is a 10–300 nm thick layer of amorphous carbon. As described above with reference to FIG. 1, layer 18 and layer 16 can be combined into one amorphous carbon layer. A variety of processes can be utilized to deposit layer 18 on surface 66 including sputter deposition.

With reference to FIG. 5, a photoresist layer 70 is provided above a top surface 68 of layer 18. Photoresist layer 70 can be a positive photoresist material having a thickness of 500 nm. Layer 70 is preferably spin-coated onto layer 18.

In FIG. 6, a conventional lithographic process can be utilized to provide apertures 72, 74 and 76 in photoresist layer 70. An exemplary lithographic process for forming apertures is a consists of exposure using an e-beam writer followed by development of the resist pattern.

Apertures 72, 74 and 76 in photoresist layer 70 are utilized to etch layer 18 and layer 16. Preferably, a chemical etch selective to layer 18 is utilized to extend aperture 72, 74 and 76 into layer 18 followed by a chemical etch selective to layer 16 to extend apertures 72, 74 and 76 through layer 16. Apertures 72, 74 and 76 expose top surface 44 of multilayer 14. Undercut 22 can be formed when layer 16 is etched.

Apertures 72, 74 and 76 form a pattern in layers 18 and 16 above multilayer 14. The pattern includes an island 82 between recesses 72 and 74 and an island 84 between recesses 74 and 76. Islands 82 and 84 can be a variety of dimensions depending upon the particular image to be transferred to the semiconductor wafer.

Referring again to FIG. 1, photoresist layer 70 can be stripped using a conventional photoresist removal process. Islands 82 and 84 can be removed in a selective etching process. The selective etching process can utilize another photoresist material.

According to one process, if layer 18 has different etch characteristics than the closest of layers 20 to layer 16, the photoresist material can cover layer 18 and be exclusive of recesses 72, 74 and 76 and islands 82 and 84. In this process, a two step etching process is utilized to remove layer 18 associated with islands 82 and 84 and layer 16 associated with islands 82 and 84.

Advantageously, use of amorphous carbon as layer 16 or layer 18 avoids high temperature deposition processes of $SiO_2$, metals, and other buffer and metal layers. The low temperature deposition of amorphous carbon can be 100° C. In contrast, high temperature deposition processes of conventional materials, such as, $SiO_2$ can be >300° C. Other negative effects or multilayer reflector films can also be avoided. Advantageously, amorphous carbon can be etched in an oxygen plasma, thereby achieving higher selectivity to the multilayer compared to $SiO_2$ etching in halogen plasmas.

It is understood that although the detailed drawings, specific examples, and particular values given provide exemplary embodiments of the present invention, the exemplary embodiments are for the purpose of illustration only. The method and apparatus in the aforementioned embodiments are not limited to the precise details and descriptions disclosed. For example, although particular films, barrier layers, and substrates are described, other materials can be utilized. Various changes may be made to the details disclosed without departing from the spirit of the invention which is defined by the following claims.

What is claimed is:

1. A mask for integrated circuit fabrication equipment, the mask comprising:
   a multilayer film at least partially relatively reflective to radiation having a wavelength of less than 70 nanometers; and
   an amorphous carbon layer above the multilayer film.

2. The mask of claim 1, further comprising a low thermal expansion substrate.

3. The mask of claim 2, wherein the amorphous carbon is 10–300 nm thick.

4. The mask of claim 3, wherein the amorphous carbon layer is patterned.

5. The mask of claim 2, wherein the substrate includes a first surface coupled to the multilayer film, and the multilayer film has a second surface, the second surface being positioned to receive EUV radiation.

6. The mask of claim 1, further comprising an absorber layer above the amorphous carbon layer.

7. The mask of claim 6, wherein the absorber layer includes chromium (Cr).

8. The mask of claim 1, wherein the amorphous carbon layer provides a buffer layer and an absorber layer.

9. The mask of claim 8, wherein the amorphous carbon layer has a cross-sectional thickness of 10–300 nm.

10. The mask of claim 7, wherein the amorphous carbon layer is deposited at a temperature below 100° C.

11. A lithographic mask for cation equipment, the mask comprising:
    means for reflecting radiation; and
    means for absorbing the radiation, wherein the means for reflecting and means for absorbing includes an amorphous carbon layer located above the means for reflecting radiation.

12. The lithographic mask of claim 11, wherein means for reflecting is a multilayer film.

13. The lithographic mask of claim 11, where the radiation is EUV radiation.

14. The lithographic mask of claim 11, wherein the amorphous carbon layer has a thickness of 10–300 nm.

15. The lithographic mask of claim 14, wherein the means for absorbing further includes an absorber layer above the amorphous carbon layer.

16. A method of manufacturing a lithographic mask for fabrication equipment, the method comprising:
    providing a multilayer film on a substrate;
    providing an amorphous carbon mask over the multilayer film; and
    etching the amorphous carbon mask selectively to form a pattern.

17. The method of claim 16, further comprising removing islands of the amorphous carbon mask from an aperture associated with the pattern.

18. The method of claim 1, wherein the multilayer film includes silicon of molybdenum.

19. The method of claim 16, wherein the amorphous carbon mask has a deposition temperature 100° C.

20. The method of claim 19, wherein the amorphous carbon mask is covered by a patterned metal layer.

* * * * *

UNITED STATES PATENT AND TRADEMARK OFFICE
CERTIFICATE OF CORRECTION

PATENT NO. : 6,869,734 B1
DATED : March 22, 2005
INVENTOR(S) : Christopher F. Lyons, Cyrus E. Tabery and Richard J. Huang It is certified that error appears in the above-identified patent and that said Letters Patent is hereby corrected as shown below:

Column 6,
Line 7, please replace "cation" with -- fabrication --.
Line 16, please replace "where" with -- wherein --.
Line 33, please replace "claim 1" with -- claim 19 --.
Line 34, please replace "of" with -- or --.
Line 36, before "100º C," please insert -- of --.

Signed and Sealed this

Fourth Day of October, 2005

JON W. DUDAS
*Director of the United States Patent and Trademark Office*